(12) United States Patent
Cho et al.

(10) Patent No.: US 10,892,433 B2
(45) Date of Patent: Jan. 12, 2021

(54) QUANTUM DOT LIGHT EMITTING DEVICE INCLUDING LIGAND-SUBSTITUTED QUANTUM DOT LIGHT EMITTING LAYER WITH POLYMER HAVING AMINE GROUPS AND METHOD FOR FABRICATING THE SAME

(71) Applicants: Korea University Research and Business Foundation, Seoul (KR); Korea Institute of Science and Technology, Seoul (KR)

(72) Inventors: Jinhan Cho, Seoul (KR); Wan Ki Bae, Seoul (KR); Ikjun Cho, Seoul (KR)

(73) Assignees: Korea University Research and Business Foundation, Seoul (KR); Korea Institute of Science and Technology, Seoul (KR)

( * ) Notice: Subject to any disclaimer, the term of this patent is extended or adjusted under 35 U.S.C. 154(b) by 0 days.

(21) Appl. No.: 15/612,768

(22) Filed: Jun. 2, 2017

(65) Prior Publication Data

US 2017/0352827 A1 Dec. 7, 2017

(30) Foreign Application Priority Data

Jun. 3, 2016 (KR) .................. 10-2016-0069720

(51) Int. Cl.
*H01L 51/50* (2006.01)
*H01L 51/56* (2006.01)
(Continued)

(52) U.S. Cl.
CPC .......... *H01L 51/502* (2013.01); *C09K 11/672* (2013.01); *C09K 11/883* (2013.01);
(Continued)

(58) Field of Classification Search
CPC ......... H01L 31/035218; H01L 51/0034; H01L 51/502; H01L 51/5072; C09K 11/672; C09K 11/883
See application file for complete search history.

(56) References Cited

U.S. PATENT DOCUMENTS

| | | | |
|---|---|---|---|
| 9,054,330 B2 | 6/2015 | Qian et al. | |
| 2006/0177376 A1* | 8/2006 | Tomalia | B22F 1/0018 424/9.3 |

(Continued)

FOREIGN PATENT DOCUMENTS

| | | | |
|---|---|---|---|
| KR | 20120038472 A | 4/2012 | |
| KR | 101505423 B1 | 3/2015 | |

OTHER PUBLICATIONS

Cho, I. et al. "Multifunctional Dendrimer Ligands for High-Efficiency, Solution-Processed Quantum Dot Light-Emitting Diodes." ACS Nano 2017, 11, 684-692. (Year: 2016).*

(Continued)

*Primary Examiner* — Eduardo A Rodela
*Assistant Examiner* — Christopher M Roland
(74) *Attorney, Agent, or Firm* — Fox Rothschild LLP (57) ABSTRACT

Disclosed is a quantum dot light emitting device including a ligand-substituted quantum dot light emitting layer with a polymer having amine groups. The introduction of the ligand-substituted quantum dot light emitting layer with a polymer having amine groups changes the energy level of an electron transport layer and enables control over the charge injection properties of the device so that the flow of electrons can be controlled. In addition, the ligand substitution is effective in removing oleic acid as a stabilizer of quantum dots to prevent an increase in driving voltage caused by the introduction of the additional material, achieving markedly improved efficiency of the device. Also disclosed is a (Continued)

method for fabricating the quantum dot light emitting device.

10 Claims, 10 Drawing Sheets

(51) Int. Cl.
*H05B 33/14* (2006.01)
*H01L 31/0352* (2006.01)
*C09K 11/67* (2006.01)
*C09K 11/88* (2006.01)
*H01L 51/00* (2006.01)

(52) U.S. Cl.
CPC .. *H01L 31/035218* (2013.01); *H01L 51/0034* (2013.01); *H01L 51/5072* (2013.01); *H01L 51/56* (2013.01); *H05B 33/14* (2013.01); *H01L 51/5012* (2013.01); *H01L 2251/303* (2013.01); *H01L 2251/305* (2013.01); *H01L 2251/306* (2013.01)

(56) References Cited

U.S. PATENT DOCUMENTS

| | | | |
|---|---|---|---|
| 2007/0096078 A1* | 5/2007 | Lee | B82Y 10/00 257/14 |
| 2010/0308369 A1* | 12/2010 | Gleason | H01L 51/0037 257/103 |
| 2011/0284819 A1* | 11/2011 | Kang | B82Y 20/00 257/9 |
| 2012/0138894 A1 | 6/2012 | Qian et al. | |
| 2012/0319030 A1* | 12/2012 | Cho | B82Y 30/00 252/62.54 |
| 2015/0295035 A1* | 10/2015 | Ono | H01L 29/78696 136/252 |

OTHER PUBLICATIONS

Mashford et al., "High-efficiency quantum-dot light-emitting devices with enhanced charge injection," Nature Photonics (May 2013); 7:407-412.

Dai et al., "Solution-processed, high-performance light-emitting diodes based on quantum dots," Nature (2014); 515:1-15.

Cho et al., "High-performance crosslinked colloidal quantum-dot light-emitting diodes," Nature Photonics (Jun. 2009); 3:341-345.

Zhou et al., "A Universal Method to Produce Low-Work Function Electrodes for Organic Electronics," Science (2012); 336:327-332.

Lim et al., "Highly Efficient Cadmium-Free Quantum Dot Light-Emitting Diodes Enabled by the Direct Formation of Excitons with InP@ZnSeS Quantum Dots," ACS Nano (2013); 7(10:9019-9026.

Kim et al., "INverted Quantum Dot Light Emitting Diodes using Polyethylenimine ethoxylated modified ZnO," Scientific Reports 5:8969 (5 pages).

Yang et al., "High-efficiency light-emitting devices based on quantum dots with tailored nanostructures," Nature Photonics (published online: Mar. 23, 2015) (8 pages).

* cited by examiner

QUANTUM DOT LIGHT EMITTING DEVICE INCLUDING LIGAND-SUBSTITUTED QUANTUM DOT LIGHT EMITTING LAYER WITH POLYMER HAVING AMINE GROUPS AND METHOD FOR FABRICATING THE SAME

BACKGROUND OF THE INVENTION

1. Field of the Invention

The present invention relates to a quantum dot light emitting device including a ligand-substituted quantum dot light emitting layer with a polymer having amine groups and a method for fabricating the quantum dot light emitting device.

2. Description of the Related Art

The importance of displays as visual information transmission media in information-oriented society is more and more emphasized. Displays are required to consume less power, be lighter in weight, and have higher definition in order to take a major place in the future.

In attempts to meet these requirements, quantum dot light emitting devices are currently under extensive study. Such quantum dot light emitting devices can be slimmed down and have the advantages of high color purity and long-term driving when compared to other organic displays.

Quantum dots (QDs) are semiconductor nanocrystals. Nanometer-sized quantum dots emit light when excited electrons fall from the conduction band to the valence band. At this time, quantum dots having smaller sizes emit light at a shorter wavelength, and vice versa. As such, quantum dots have unique electrical and optical properties distinguished from existing semiconductor materials. Accordingly, control over the size of quantum dots enables the emission of visible light at a desired wavelength therefrom. Quantum dots can simultaneously produce various colors of light by varying their size, shape and composition.

Quantum dot light emitting diode devices are display devices using quantum dots as materials for light emitting layers. Desired natural colors can be obtained from quantum dot light emitting diode devices by controlling the size of the quantum dots. Quantum dot light emitting diode devices have high color gamuts and exhibit luminances comparable to other light emitting diodes. Due to these advantages, quantum dot light emitting diode devices have received attention as next-generation light sources that can overcome the disadvantages of light emitting diodes.

On the other hand, the performance of such quantum dot light emitting diode devices is determined by charge injection properties into the devices and leakage current from the devices. Existing quantum dot light emitting diode devices suffer from difficulty in controlling charge injection properties. Under these circumstances, a great deal of research has been conducted on fabrication processes and structures of quantum dot light emitting diode devices that can overcome this difficulty (B. S. Mashford, M. Stevenson, Z. Popovic, C Hamilton, Z. Zhou, C. Breen, J. Steckel, V. Bulovic, M. Bawendi, S. Coe-Sullivan, P. T. Kazlas, *Nat. Photon.* 2013, 7, 407, X. Dai, Z. Zhang, Y. Jin, Y. Niu, H. Cao, X. Liang, L. Chen, J. Wang, X. Peng, *Nature* 2014, 515, 96).

Existing quantum dot light emitting devices use various materials, such as $TiO_2$, PVK, and TFB, for charge transport layers, including electron and hole injecting layers, for the purpose of improving their efficiency. However, quantum dot light emitting devices have a limitation in that different energy levels and charge mobilities need to be controlled (K.-S. Cho, E. K. Lee, W.-J. Joo, E. Jang, T.-H. Kim, S. J. Lee, S.-J. Kwon, J. Y. Han, B.-K. Kim, B. L. Choi, J. M. Kim, *Nat. Photon.* 2009, 3, 341, Y. Yang, Y. Zheng, W. Cao, A. Titov, J. Hyvonen, J. R. Manders, J. Xue, P. H. Holloway, L. Qian, *Nat. Photon.* 2015, 9, 259).

In view of this limitation, methods of changing charge mobilities and energy levels by coating particular materials, such as PFN and PEIE, between quantum dots and charge transport layers have attracted considerable attention due to the ease of use of existing structuresln this connection, studies have been ongoing (H. H. Kim, S. Park, Y. Yi, D. I. Son, C. Park, D. K. Hwang, W. K. Choi, *Sci. Rep.* 2015, 5, 8968, J. Lim, M. Park, W. K. Bae, D. Lee, S. Lee, C. Lee, K. Char, *ACS Nano* 2013, 7, 9019). However, such methods are disadvantageous in that since the coated materials are simply stacked by the van der Waals force, stabilizers should be present between the quantum dots and the coated materials. The presence of the stabilizers increases the distance between the quantum dots and the charge transport layers. That is, the stabilizers serve as insulating layers.

SUMMARY OF THE INVENTION

The present invention has been made in view of the above-described problems and is intended to provide a quantum dot light emitting device whose performance is markedly improved by controlled charge injection properties based on a simple ligand substitution reaction between an electron transport layer (ETL) and quantum dots, and a method for fabricating the quantum dot light emitting device.

One aspect of the present invention provides a quantum dot light emitting device including an electron transport layer and a quantum dot light emitting layer formed on the electron transport layer and ligand-substituted with a polymer having amine groups.

According to one embodiment of the present invention, the polymer having amine groups may be selected from the group consisting of a dendrimer having amine groups, polyethyleneimine (PEI), and polyethyleneimine ethoxylate (PEIE).

The dendrimer having amine groups may be a polyamidoamine dendrimer.

The generation number of the dendrimer having amine groups may be from 0 to 5.

According to another embodiment of the present invention, the quantum dot light emitting layer may have a multilayer structure consisting of 1 to 10 layers.

According to another embodiment of the present invention, the electron transport layer may be formed of an oxide selected from ZnO, $TiO_2$, $WO_3$, and $SnO_2$.

According to another embodiment of the present invention, the quantum dot light emitting layer may include a nano-sized semiconductor compound of Groups 2-6 or 3-5 elements.

The nano-sized semiconductor compound may include cadmium selenide (CdSe), cadmium sulfide (CdS), cadmium telluride (CdTe), zinc selenide (ZnSe), zinc telluride (ZnTe), zinc sulfide (ZnS), mercury telluride (HgTe), indium arsenide (InAs), indium phosphide (InP), gallium arsenide (GaAs) or a combination thereof.

Another aspect of the present invention provides a method for fabricating a quantum dot light emitting device, including (a) forming an electron transport layer on a substrate, (b)

coating a polymer having amine groups on the electron transport layer to form a polymer layer, and (c) coating quantum dots on the polymer layer to form a ligand-substituted quantum dot light emitting layer with the polymer having amine groups.

According to one embodiment of the present invention, the quantum dot light emitting layer and the electron transport layer may be formed by solution processing.

According to a further embodiment of the present invention, the polymer having amine groups may be selected from the group consisting of a dendrimer having amine groups, polyethyleneimine (PEI), and polyethyleneimine ethoxylate (PEIE).

The dendrimer having amine groups may be a polyamidoamine dendrimer.

The generation number of the dendrimer having amine groups may be from 0 to 5.

According to another embodiment of the present invention, the quantum dot light emitting layer may have a multilayer structure consisting of 1 to 10 layers.

According to the present invention, the introduction of the ligand-substituted quantum dot light emitting layer with the polymer having amine groups changes the energy level of the electron transport layer and enables control over the charge injection properties of the device so that the flow of electrons can be controlled. In addition, the ligand substitution is effective in removing oleic acid as a stabilizer of quantum dots to prevent an increase in driving voltage caused by the introduction of the additional material, achieving markedly improved efficiency of the device.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

The present invention will now be described in more detail.

Existing quantum dot light emitting devices use various materials, such as $TiO_2$, PVK, and TFB, for charge transport layers, including electron and hole injecting layers, for the purpose of improving their efficiency. However, quantum dot light emitting devices have a limitation in that different energy levels and charge mobilities need to be controlled.

In view of this limitation, methods of changing charge mobilities and energy levels by coating particular materials, such as PFN and PEIE, between quantum dots and charge transport layers have been disclosed in the literature. However, such methods are disadvantageous in that since the coated materials are simply stacked by the van der Waals force, stabilizers should be present between the quantum dots and the coated materials. The presence of the stabilizers increases the distance between the quantum dots and the charge transport layers. That is, the stabilizers serve as insulating layers, causing poor driving efficiency of devices. As a result of extensive investigation to solve the above-described problems, the present inventors have found that when a quantum dot light emitting layer is ligand-substituted with a polymer having amine groups, the energy level of an electron transport layer is changed, the charge injection properties of a device can be controlled, and oleic acid as a quantum dot stabilizer is effectively removed to prevent an increase in driving voltage, achieving markedly improved device efficiency. The present invention has been accomplished based on this finding.

The present invention provides a quantum dot light emitting device including an electron transport layer and a quantum dot light emitting layer formed on the electron transport layer and ligand-substituted with a polymer having amine groups.

The polymer having amine groups may be selected from the group consisting of a dendrimer having amine groups, polyethyleneimine (PEI), and polyethyleneimine ethoxylate (PEIE).

The dendrimer refers to a spherical macromolecule having a special three-dimensional structure in which regular unit structures are repeatedly stretched out from the central core. The dendrimer includes layers formed around the core and can be classified into first generation (G1), second generation (G2), third generation (G3), and higher generations according to the growth stage of branches.

Any suitable dendrimer having amine groups known in the art may be used in the present invention. Preferably, the dendrimer is a polyamidoamine dendrimer (PAD).

The generation number of the dendrimer having amine groups is preferably from 0 to 5. More preferably, the dendrimer having amine groups is selected from dendrimers of the second to fourth generation, which can be seen from the results in the Examples section that follows.

According to one embodiment of the present invention, the ligand-substituted quantum dot light emitting layer with the polymer having amine groups may have a multilayer structure consisting of 1 to 10 layers depending on the size and kind of the quantum dots and the application of the device.

The electron transport layer facilitates the injection of electrons from a cathode of the light emitting device and serves to transport electrons to the quantum dot light emitting layer. The electron transport layer is preferably formed of an oxide selected from ZnO, $TiO_2$, $WO_3$, and $SnO_2$, more preferably ZnO.

The quantum dot light emitting layer is a layer filled with nano-sized quantum dots having a diameter of 1 to 100 nm. The quantum dots may include a nano-sized semiconductor compound of Groups 2-6 or 3-5 elements.

Generally, the quantum dots have a core-shell structure in which the shell surrounds the surface of the light emitting central core to protect the core. Long-chained oleic acid ligands surround the surface of the shell to disperse the quantum dots in a solvent. As described before, the ligand substitution of the quantum dots with the polymer having amine groups enables the removal of oleic acid surrounding the quantum dots, leading to a marked improvement in the driving efficiency of the device. This can be seen from the results in the Examples section that follows.

The nano-sized semiconductor compound may be cadmium selenide (CdSe), cadmium sulfide (CdS), cadmium telluride (CdTe), zinc selenide (ZnSe), zinc telluride (ZnTe), zinc sulfide (ZnS), mercury telluride (HgTe), indium arsenide (InAs), $Cd_{1-x}Zn_xSe_{1-y}S_y'$, CdSe/ZnS, indium phosphide (InP) or gallium arsenide (GaAs).

The quantum dots may be synthesized, mainly by a wet process in which a precursor of the quantum dots is added to an organic solvent and is allowed to grow into particles. Light of various wavelength bands can be obtained by varying the energy bandgap of the quantum dots depending on the extent of growth of the particles.

The present invention also provides a method for fabricating a quantum dot light emitting device, including (a) forming an electron transport layer on a substrate, (b) coating a polymer having amine groups on the electron transport layer to form a polymer layer, and (c) coating quantum dots on the polymer layer to form a ligand-substituted quantum dot light emitting layer with the polymer having amine groups.

The electron transport layer and the quantum dot light emitting layer may be formed by solution processing. For example, the electron transport layer may be formed by dispersing an oxide, such as ZnO, $TiO_2$, $WO_3$ or $SnO_2$, in a solvent, coating the dispersion on a substrate, and volatilizing the solvent. The quantum dot light emitting layer filled with nano-sized quantum dots may be formed by dispersing the quantum dots in a solvent, coating the dispersion on the electron transport layer coated with a polymer having amine groups, and volatilizing the solvent.

The present invention will be explained in more detail with reference to the following examples. However, it will be obvious to those skilled in the art that these examples are in no way intended to limit the scope of the invention.

Example 1: Fabrication of Inventive Quantum Dot Light Emitting Devices

Different generations (Generations 0, 1, 2, 3, 4, and 5) of polyamidoamine dendrimers (PADs) having amine groups were prepared. Indium tin oxide (ITO) was deposited on a glass substrate and a ZnO electron transport layer was deposited thereon by a sol-gel process. Each of the PADs was coated on the electron transport layer. A solution of CdSe/CdS colloidal quantum dots (QA-QDs) surrounded by oleic acid ligands was spin coated on the polyamidoamine-coated electron transport layer at a rate of 3000-4000 rpm or the substrate on which the electron transport layer was deposited was dipped in the solution of the quantum dots. As a result, the quantum dots reacted with the polyamidoamine coated on the electron transport layer to form a ligand-substituted quantum dot light emitting layer ((PAD G #/OA-QD)$_n$, where # representing the generation number is an integer of 0-5 and n representing the layer number of the light emitting layer is an integer of 1-10). Next, the oleic acid separated from the quantum dots by the ligand substitution was removed by washing, and as a result, the quantum dots bound to the ZnO and the polyamidoamine remained in the quantum dot light emitting layer. That is, the oleic acid ligands having surrounded the quantum dots were removed from the final quantum dot light emitting layer by the ligand substitution reaction. In conclusion, the ligand substitution enables effective removal of the oleic acid acting as an insulator against charge transport between the electron transport layer and the quantum dot light emitting layer so that the resistance of the thin film can be minimized In addition, the ligand substitution enables the fabrication of a light emitting device including the quantum dot light emitting layer whose energy level is controllable depending on the generation number of the substituted ligands. Next, 4,4'-bis (carbazol-9-yl)biphenyl (CBP) was deposited on the quantum dot light emitting layer to form a hole transport layer. $MoO_x$ (where x is from 2 to 3) was deposited on the hole transport layer to control the energy level between the hole transport layer and the electrode, and Al was deposited thereon to form an anode, completing the fabrication of a quantum dot light emitting device (FIGS. 1-12).

Figure 1:
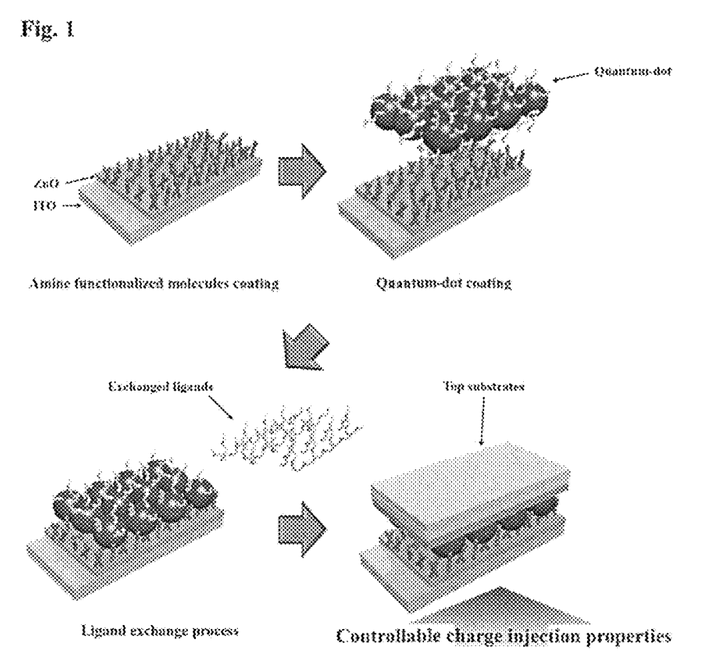
FIG. 1 is a process flow diagram illustrating a method for fabricating a quantum dot light emitting device according to the present invention.
Figure 13:
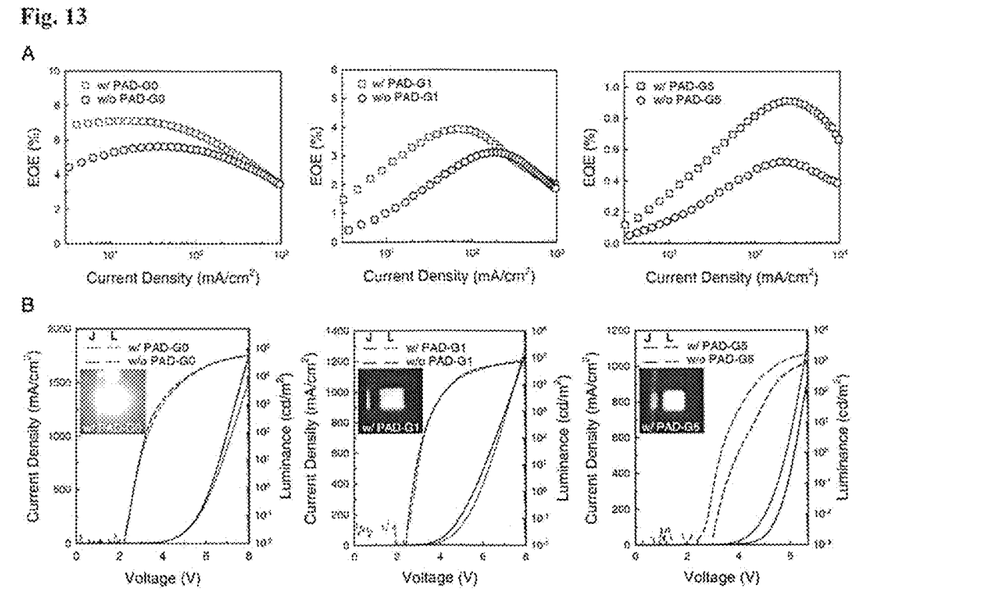
FIG. 13 shows (A) external quantum efficiencies of quantum dot light emitting devices using PAD ligands and various compositions of red/green/blue quantum dots and (B) current density-voltage-luminance curves of the devices.
Figure 14:
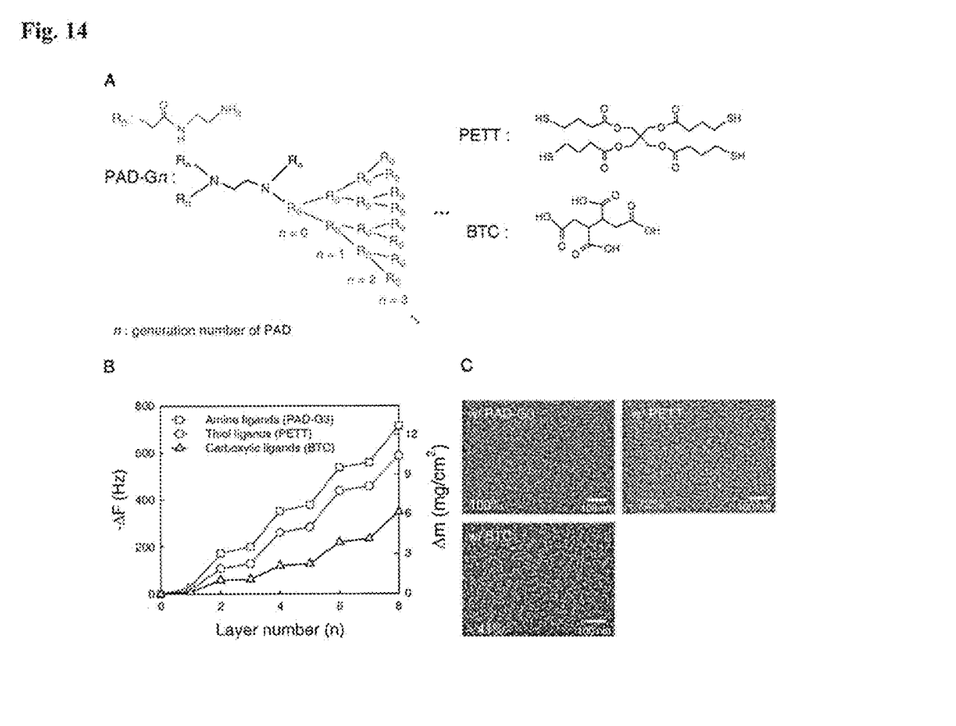
FIG. 14 shows (A) a diagram of PAD ligands having amine groups and diagrams of pentaerythritol tetrakis(3-mercaptopropionate) (PETT) having thiol groups, and 1,2,3,4,-butanetetracarboxilic acid (BTC) having carboxyl groups, which have chemical structures similar to the PAD ligands, (B) the amounts of each of the PAD, PETT, and BTC ligands and quantum dots alternately loaded on ZnO thin films, which were measured by quartz crystal microgravimetry (QCM), and (C) top SEM images of quantum dots loaded on the PAD, PETT, and BTC ligands: the surface loading densities of the quantum dots calculated through the SEM images were 100% for PAD-G3, 72% for PETT, and 41% for BTC.

Example 2: Fabrication of Inventive Light Emitting Diode Devices Using Red/Green/Blue Quantum Dots ITO, ZnO, and PAD ligands were prepared and an electron transport layer coated with the polyamidoamine was formed in the same manner as in Example 1. A solution of 2-3 wt % CdSe/Cd$_{1-x}$Zn$_x$S red quantum dots (where x is from 0 to 1 and increases gradually from 0 (the core of the quantum dots) to 1 (the outermost surface of the shell of the quantum dots (chemical composition gradient)), Cd$_{1-x}$Zn$_x$Se/ZnS green quantum dots (where x is from 0 to 1 and increases gradually from 0 (the outermost portion of the core of the quantum dots) to 1 (the starting surface of the shell of the quantum dots, with the proviso that x is 0 in the core) or Cd$_{1-x}$Zn$_x$S/ZnS blue quantum dots (where x is from 0 to 1 and increases gradually from 0 (the outermost portion of the core of the quantum dots) to 1 (the starting surface of the shell of the quantum dots, with the proviso that x is 0 in the core) surrounded by oleic acid ligands (OA-QDs) was spin coated on the polyamidoamine-coated electron transport layer at a rate of 3000-4000 rpm or the substrate on which the electron transport layer was deposited was dipped in the solution of the quantum dots. As a result, the quantum dots reacted with the polyamidoamine coated on the electron transport layer to form a ligand-substituted quantum dot light emitting layer. The subsequent procedure was the same as that described in Example 1 (FIGS. 1, 13, and 14).

Figure 15:
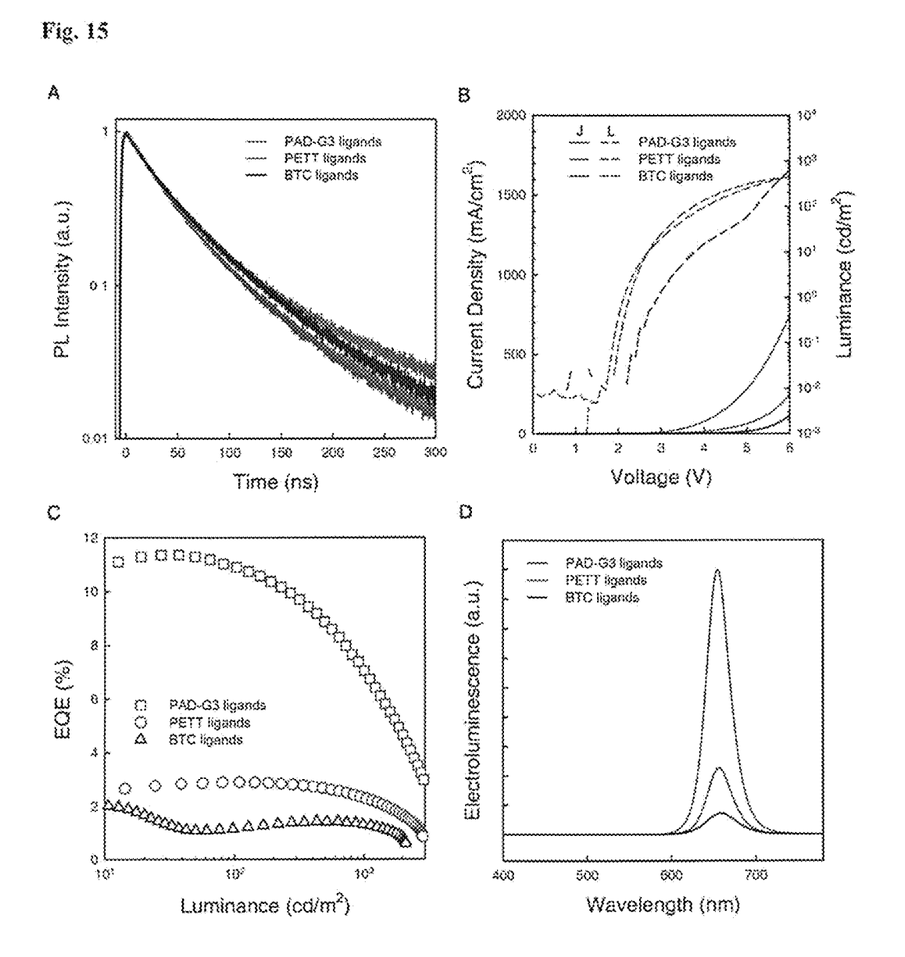
FIG. 15 shows (A) photoluminescence (PL) decay dynamics when quantum dots were coated on PAD-G3, PETT, and BTC ligands applied to respective ZnO/ITO substrates, (B) current density-voltage-luminance curves of quantum dot electroluminescence diode devices using PAD, PETT, and BTC ligands, (C) external quantum efficiency-luminance curves of the devices, and (D) electroluminescence spectra (10.2 mA/cm$^2$) of the devices.

Comparative Example 1: Fabrication of Quantum Dot Light Emitting Devices Using Ligands Similar to the Ligands Used in the Inventive Quantum Dot Light Emitting Devices ITO and ZnO were prepared and an electron transport layer was formed in the same manner as in Example 1. Polyamidoamine (PAD) ligands having amine groups, PETT ligands having thiol groups or BTC ligands having carboxyl groups were coated on the electron transport layer. A solution of 2-3 wt % CdSe/CdS colloidal quantum dots (QA-QDs) surrounded by oleic acid ligands was spin coated on the ligand-coated electron transport layer at a rate of 3000-4000 rpm or the substrate on which the electron transport layer was deposited was dipped in the solution of the quantum dots. As a result, the quantum dots reacted with the ligands coated on the electron transport layer to form a ligand-substituted quantum dot light emitting layer. The subsequent procedure was the same as that described in Example 1 (FIGS. 1, 14, and 15).

Figure 3:
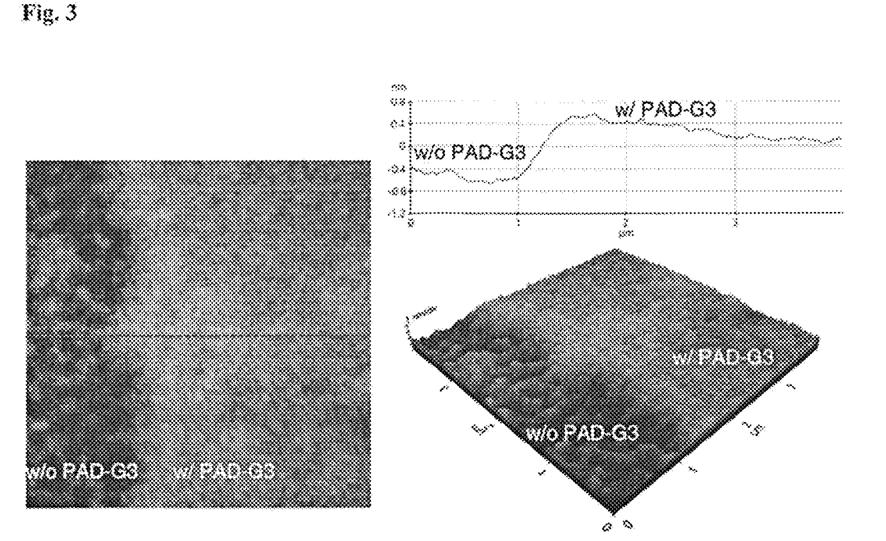
FIG. 3 is an AFM image showing a change in the surface roughness of an underlying substrate and a change in the thickness of substituted ligands before and after ligand substitution of a quantum dot light emitting layer with a polyamidoamine dendrimer (PAD)
Figure 4:
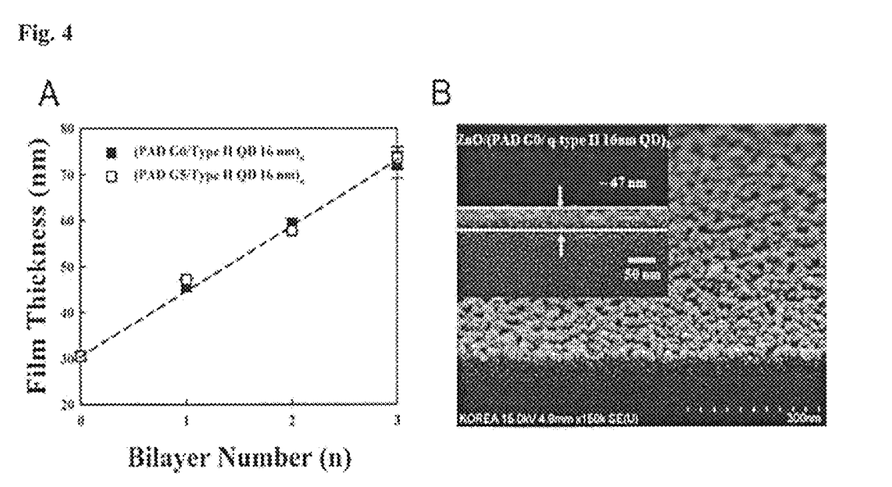
FIG. 4 shows (A) the thicknesses of ligand-substituted quantum dot light emitting layers consisting of different numbers of layers with different generations of polyamidoamine dendrimers (PADs) and (B) a SEM image of a ligand-substituted quantum dot light emitting layer with a PAD coated on an electron transport layer.

Evaluation Example 1: Observation of Thicknesses of the Ligand-Substituted Quantum Dot Light Emitting Layers Consisting of Different Numbers of Layers with Different Generations of the Dendrimers Having Amine Groups FIG. 2 shows FT-IR spectra confirming the removal of oleic acid surrounding the quantum dots of the quantum dot light emitting layer by ligand substitution with the polyamidoamine dendrimer (PAD), FIG. 3 is an AFM image showing a change in the surface roughness of the underlying substrate and a change in the thickness of the substituted ligands before and after ligand substitution of the quantum dot light emitting layer with the polyamidoamine dendrimer (PAD), and FIG. 4 shows (A) the thicknesses of the ligand-substituted quantum dot light emitting layers consisting of different numbers of layers with different generation numbers of the polyamidoamine dendrimers (PADs) and (B) a SEM image of the ligand-substituted quantum dot light emitting layer with the PAD coated on the electron transport layer.

Figure 2:
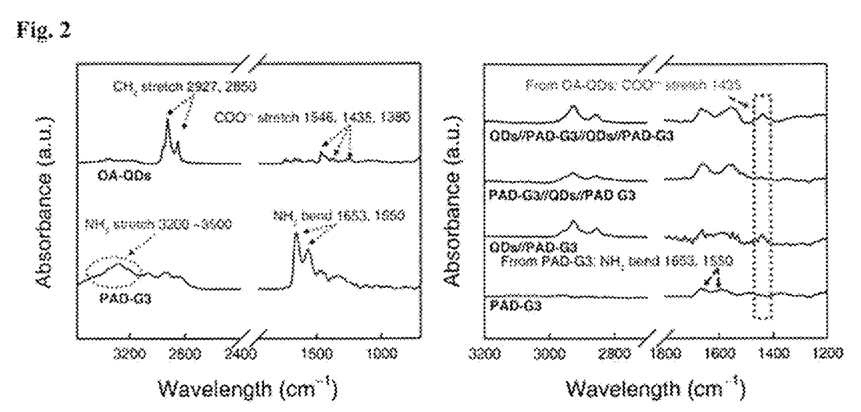
FIG. 2 shows FT-IR spectra confirming the removal of oleic acid surrounding quantum dots of a quantum dot light emitting layer by ligand substitution with a polyamido amine dendrimer (PAD)

FIG. 2 reveals successful ligand substitution between the dendrimer having amine groups and the quantum dots (FIG. 2). FIG. 3 confirms that the thickness of the PAD ligands was ≤~1 nm. (A) of FIG. 4 reveals that no substantial changes in the thickness of the thin films were observed with increasing layer numbers of PAD G0 and PAD G5. (B) of FIG. 4 confirms that the PAD and the quantum dots were uniformly coated on the ZnO electron transport layer. From these results, it can be seen that the ligand substitution of the quantum dots leads to the formation of monolayer quantum dot thin films through chemical bonding between the PADs and the quantum dots, demonstrating improved uniformity of the layers and high reproducibility of thin film formation compared to single layers formed by spin coating of a controlled concentration of quantum dots.

Figure 5:
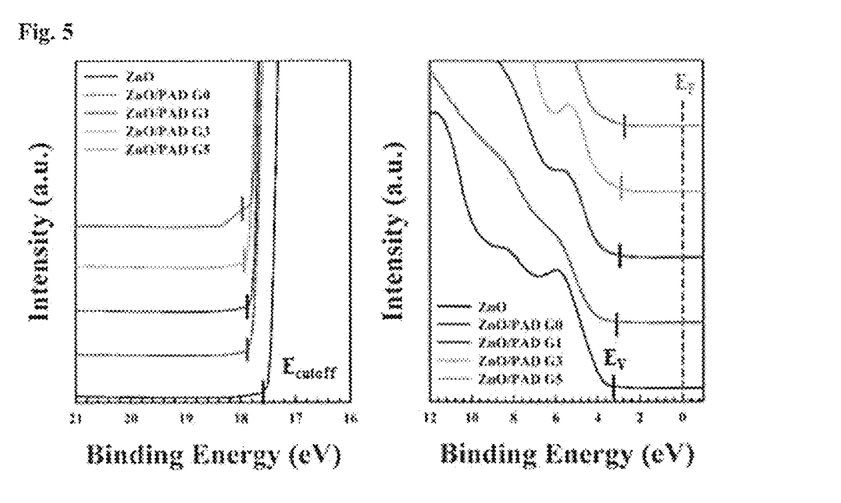
FIG. 5 shows changes in the energy level of electron transport layers (ZnO) coated with different generations of polyamidoamine dendrimers (PADs)
Figure 6:
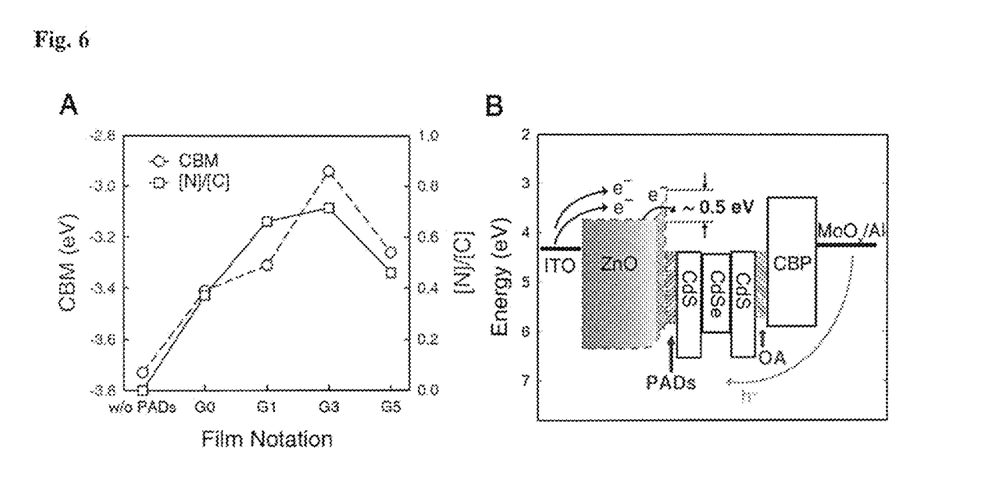
FIG. 6 shows (A) conduction band minimum energy levels (CBMs) and nitrogen/carbon ratios ([N]/[C]) when ligand-substituted with different generations of polyamidoamine dendrimers (PADs) and (B) an energy band diagram of a quantum dot light emitting device including PAD ligands.

Evaluation Example 2: Measurement of Changes in Energy Level Depending on Generation Number of the Dendrimers Having Amine Groups FIG. 5 shows changes in the energy level of the electron transport layers (ZnO) coated with different generations of polyamidoamine dendrimers (PADs), which were measured by ultraviolet photoelectron spectroscopy (UPS). FIG. 6 shows (A) conduction band minimum energy levels (CBMs) and nitrogen/carbon ratios ([N]/[C]) according to the generation number of the PAD dendrimers and (B) an energy band diagram of the quantum dot light emitting device including the PAD ligands.

Specifically, the number of the amine groups increased from 4 to 128 and the size of the molecules increased from ≤~1.5 nm to ≤~5 nm with increasing PAD size and increasing PAD generation number from G0 to G5, and as a result, the minimum conduction band energy level was lowered gradually. These results indicate that the PAD introduction can reduce the injection rate of electrons from the electrode into the quantum dots. As shown in FIG. 5, the energy level was greatly changed with increasing generation number of PAD bound to the ZnO electron transport layer. This is because the amine groups were bound to the ZnO to form dipoles, which changed the surface energy. The amount of the amine groups bound to the ZnO per unit area increased with increasing generation number, resulting in increased conduction band and Fermi level. These resultsare consistent with the previous reports (Y. Zhou, C. Fuentes-Hernandez, J. Shim, J Meyer, A. J. Giordano, H. Li, P. Winget, T. Papadopoulos, H. Cheun, J. Kim, M. Fenoll, A. Dindar, W. Hasket, E. Najafabadi, T. M. Khan, H. Sojoudi, S. Barlow, S. Graham, J.-L. Bredas, S. R. Marder, A. Kahn, B. Kippelen, Science 2012, 336, 327-332).

Figure 7:
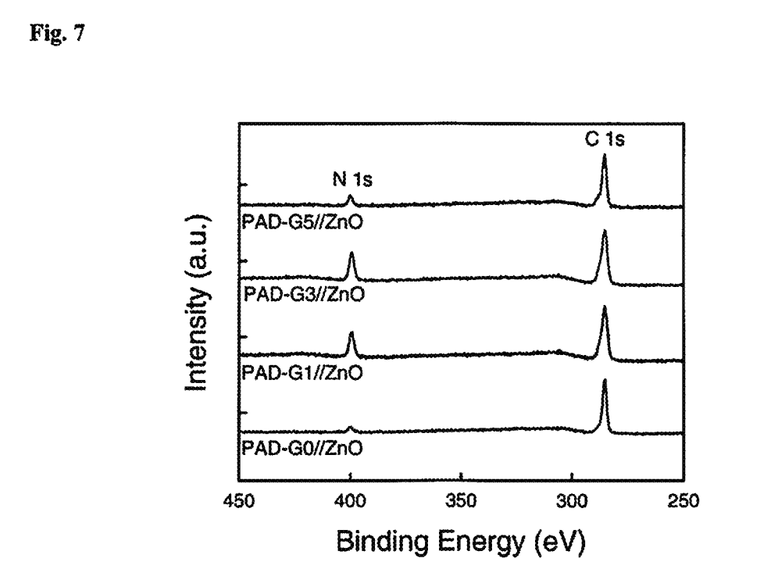
FIG. 7 shows the ratios of 1s peaks of nitrogen and carbon in different generations of PAD ligands coated on ZnO thin films.

As shown in FIGS. 6 and 7, the changes in the energy level of the ZnO electron transport layers were almost consistent with the changes in the nitrogen/carbon ratio on the ZnO surface. The mechanism of operation of the quantum dot light emitting device with varying energy levels is diagrammatically illustrated in (B) of FIG. 6. The diagram shows that the use of the dendrimer ligands having amine groups affects the charge injection properties of the inventive quantum dot light emitting devices.

Figure 8:
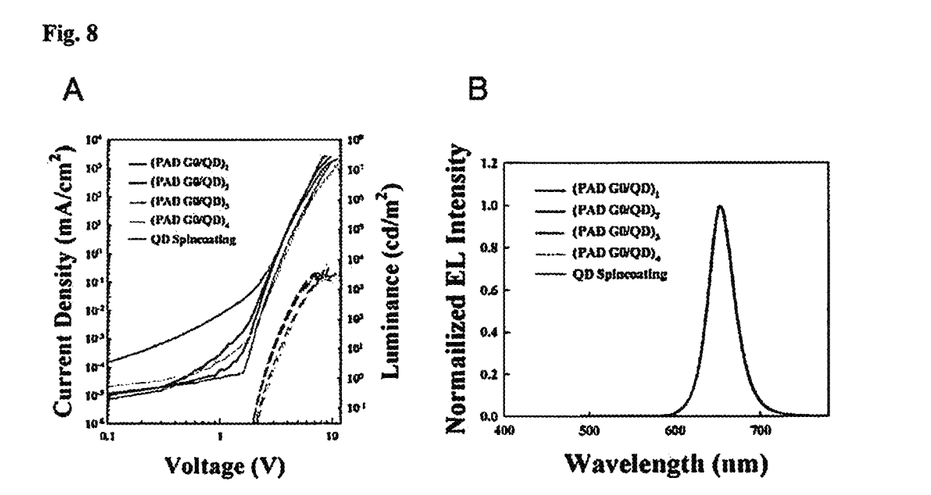
FIG. 8 shows (A) changes in current density and luminance of quantum dot light emitting devices including ligand-substituted quantum dot light emitting layers consisting of different numbers of layers with a PAD as a function of driving voltage and (B) normalized EL spectra of quantum dot light emitting devices including ligand-substituted quantum dot light emitting layers consisting of different numbers of layers with a PAD.

Evaluation Example 3: Measurement of Current Density-Luminance-EL Spectra of the Devices Including the Ligand-Substituted Quantum Dot Light Emitting Layers Consisting of Different Numbers of Layers with the Dendrimer Having Amine Groups FIG. 8 shows (A) changes in current density and luminance of the quantum dot light emitting devices including the ligand-substituted quantum dot light emitting layers with the PAD as a function of driving voltage and (B) normalized EL spectra of the quantum dot light emitting devices including the ligand-substituted quantum dot light emitting layers consisting of different numbers of layers with the PAD. The generation number of the PAD used was zero (0). The current density-luminance-EL spectra of the devices consisting of different numbers of quantum dot light emitting layers were measured with a Keithley-236 source-measure unit, a Keithley-2000 multimeter unit, a Si photodiode (Hamamatsu S5227-1010BQ), and a spectroradiometer (CS-1000A).

As the layer number of the ligand-substituted quantum dot light emitting layers with the PAD (PAD/QDs) increased, the leakage current was reduced to about one-tenth, which can be seen from the current density. There were no differences in driving voltage (~2.1 V) and light intensity between the PAD-introduced devices and the device composed of spin-coated quantum dots only. (B) of FIG. 8 shows that the electroluminescence wavelength bands of the device composed of quantum dots only and the PAD-introduced devices remained unchanged at 655 nm.

Figure 9:
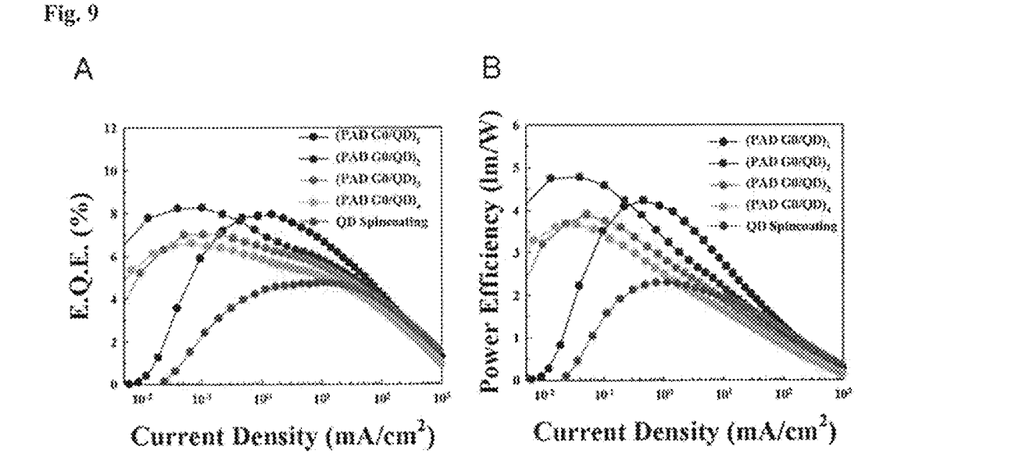
FIG. 9 shows (A) external quantum efficiencies of quantum dot light emitting devices including ligand-substituted quantum dot light emitting layers consisting of different numbers of layers with a PAD and (B) changes in the power efficiencies of quantum dot light emitting devices including ligand-substituted quantum dot light emitting layers consisting of different numbers of layers with a PAD.

Evaluation Example 4: Measurement of External Quantum Efficiencies and Power Efficiencies of the Quantum Dot Light Emitting Devices Including the Ligand-Substituted Quantum Dot Light Emitting Layers Consisting of Different Numbers of Layers with the Dendrimer Having Amine Groups Based on the results in Evaluation Example 3, the external quantum efficiencies and power efficiencies of the quantum dot light emitting devices were measured. The results are shown in FIG. 9. The external quantum efficiencies and the power efficiencies were measured with a Keithley-236 source-measure unit, a Keithley-2000 multimeter unit, a Si photodiode (Hamamatsu S5227-1010BQ), and a spectroradiometer (CS-1000A).

FIG. 9 shows (A) external quantum efficiencies of the quantum dot light emitting devices including the ligand-substituted quantum dot light emitting layers consisting of different numbers of layers with the PAD and (B) changes in the power efficiencies of the quantum dot light emitting devices including the ligand-substituted quantum dot light emitting layers consisting of different numbers of layers with the PAD. The generation number of the PAD used was zero (0).

(A) of FIG. 9 reveals that the efficiencies of the PAD-introduced devices were ~1.8 times higher than those of the device without the PAD. Particularly, the highest efficiencies were observed when one or two layers were introduced into the quantum dot light emitting layers. Likewise, (B) of FIG. 9 reveals that the power efficiencies of the PAD-introduced devices were ~2.2 times higher than those of the device without the PAD.

Figure 10:
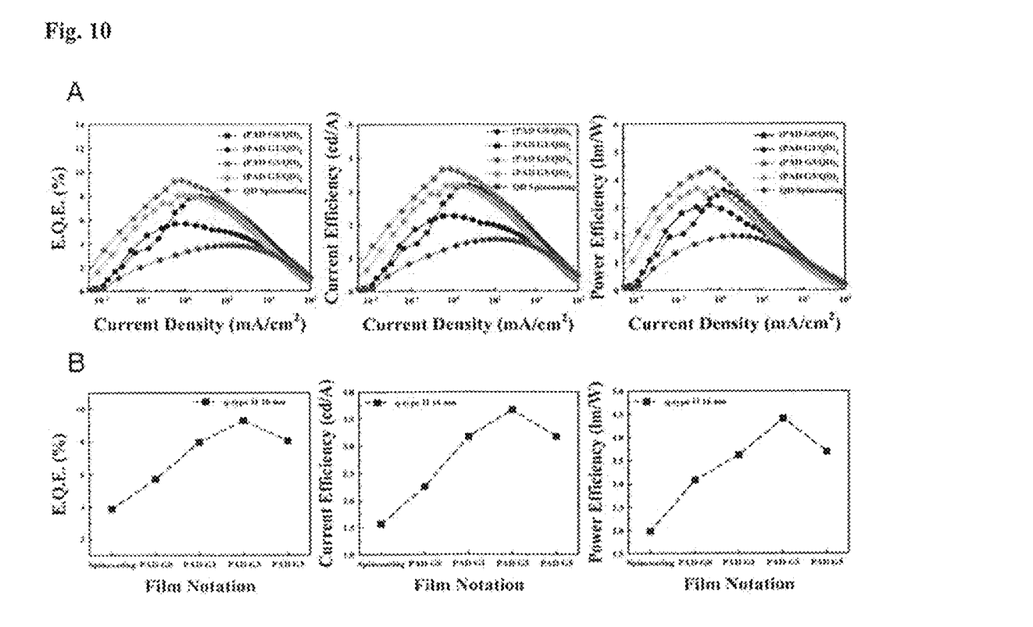
FIG. 10 shows (A) external quantum efficiencies, current efficiencies, and power efficiencies of quantum dot light emitting devices including ligand-substituted quantum dot light emitting layers with different generations of PADs and (B) maximum external quantum efficiencies, maximum current efficiencies, and maximum power efficiencies of quantum dot light emitting devices including ligand-substituted quantum dot light emitting layers with different generations of PADs.

Evaluation Example 5: Measurement of External Quantum Efficiencies, Current Efficiencies, and Power Efficiencies of the Quantum Dot Light Emitting Devices Including Different Generations of Dendrimers Having Amine Groups The external quantum efficiencies, current efficiencies, and power efficiencies of the inventive quantum dot light emitting devices including different generations (generations 0, 1, 3, and 5) of PADs were measured. The different generations of PADs were different in size and had different numbers of amine groups. The results are shown in FIG. 10. The external quantum efficiencies, current efficiencies, and power efficiencies were measured with a Keithley-236 source-measure unit, a Keithley-2000 multimeter unit, a Si photodiode (Hamamatsu S5227-1010BQ), and a spectroradiometer (CS-1000A).

FIG. 10 shows (A) external quantum efficiencies, current efficiencies, and power efficiencies of the quantum dot light emitting devices including ligand-substituted quantum dot light emitting layers with different generations of PADs and (B) maximum external quantum efficiencies, maximum current efficiencies, and maximum power efficiencies of the quantum dot light emitting devices including ligand-substituted quantum dot light emitting layers with different generations of PADs.

(A) of FIG. 10 reveals that the efficiencies increased gradually with increasing PAD generation number, i.e. with increasing ligand size and increasing number of amine groups. Particularly, the highest efficiency was observed when the generation number of the PAD was 3. From these observations, it can be confirmed that the distance between the substituted ligands and the electron transport layer together with a change in the energy level of the electron transport layer caused by the PAD introduction is a parameter affecting the performance of the quantum dot light emitting device.

Evaluation Example 6: Measurement of External Quantum Efficiencies and Power Efficiencies of the Quantum Dot Light Emitting Devices Using the Dendrimer Ligands Having Amine Groups Whose Generation Number was Optimized for the Quantum Dots FIG. 11 shows (A) a diagram of the quantum dot light emitting device including the ligand-substituted quantum dot light emitting layer with the PAD and a cross-sectional TEM image of the device, (B) external quantum efficiencies of the quantum dot light emitting device using the third generation PAD (PAD-G3) ligands and a conventional device fabricated using oleic acid, (C) internal quantum efficiencies of the quantum dot light emitting devices including the ligand-substituted quantum dot light emitting layers with different generations of PADs, estimated from the photoluminescence quantum efficiencies and external quantum efficiencies of the devices, and (D) electroluminescence intensities of the quantum dot light emitting device using the PAD-G3 ligands and a conventional device using oleic acid.

Figure 11:
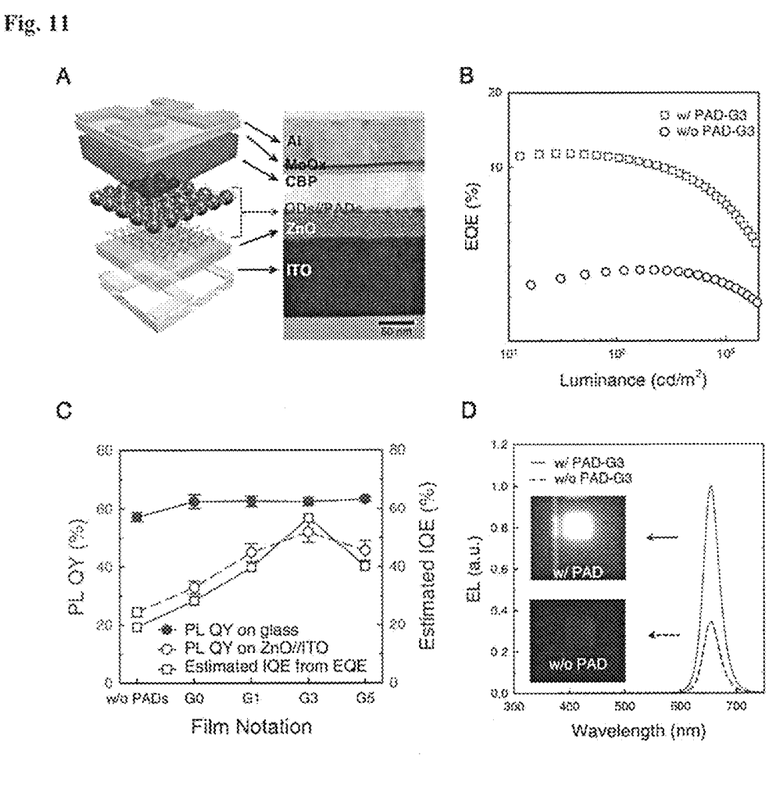
FIG. 11 shows (A) a diagram of a quantum dot light emitting device including a ligand-substituted quantum dot light emitting layer with a PAD and a cross-sectional TEM image of the device, (B) external quantum efficiencies of a quantum dot light emitting device using third generation PAD (PAD-G3) ligands and a conventional device using oleic acid, (C) internal quantum efficiencies of quantum dot light emitting devices including ligand-substituted quantum dot light emitting layers with different generations of PADs, estimated from the photoluminescence quantum efficiencies and external quantum efficiencies of the devices, and (D) electroluminescence intensities of a quantum dot light emitting device using PAD-G3 ligands and a conventional device using oleic acid.

From these results, the inventive optimized quantum dot light emitting devices were found to have at least 3 times higher external quantum efficiencies than the conventional device using oleic acid ((B) of FIG. 11). The high external quantum efficiencies were obtained because the influence by the ambient electron transport layers was minimized to prevent an additional reduction in quantum efficiency ((C) of FIG. 11). Therefore, an internal quantum efficiency of 57%, which is close to the photoluminescence quantum efficiency (~60%), can be obtained. The internal quantum efficiency refers to the internal efficiency of the quantum dot light emitting layer in the device that is obtained by excluding a reduction in structural efficiency caused by such factors as reflection and scattering from the external quantum efficiency.

These results indicate that the PAD ligands having amine groups induce changes in the energy level of the electron transport layers in the quantum dot light emitting devices, the charge injection properties can be controlled through the changes in energy level, and a reduction in quantum efficiency by the ZnO electron transport layers can be suppressed, achieving improved performance of the devices. The electroluminescence intensities of the device was also increased by ~2.5 times, as demonstrated in (D) of FIG. 11.

Figure 12:
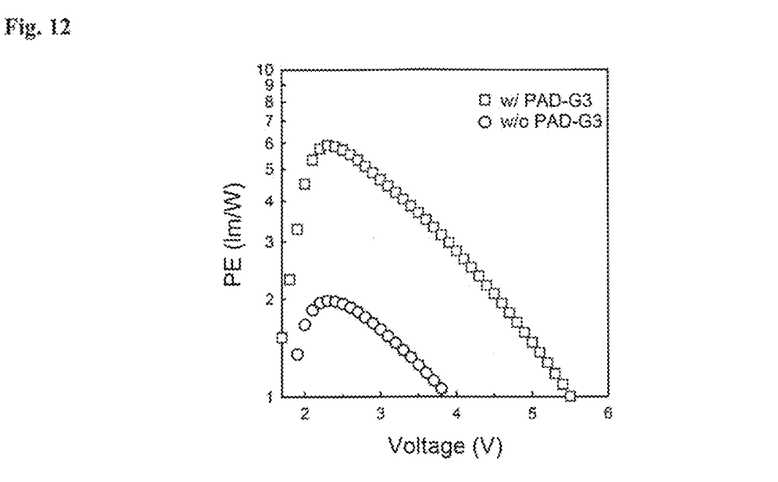
FIG. 12 shows a power efficiency-voltage curve of a quantum dot light emitting device using PAD-G3 ligands.

FIG. 12 shows a power efficiency-voltage curve of the quantum dot light emitting device using the PAD-G3 ligands. The external quantum efficiencies and power efficiencies were measured with a Keithley-236 source-measure unit, a Keithley-2000 multimeter unit, a Si photodiode (Hamamatsu S5227-1010BQ), and a spectroradiometer (CS-1000A). The inventive optimized quantum dot light emitting device was found to have a 3-fold higher power efficiency.

Evaluation Example 7: Measurement of External Quantum Efficiencies and Power Efficiencies of the Red/Green/Blue Quantum Dot Light Emitting Devices Including the Dendrimer Ligands Having Amine Groups The performance characteristics of the quantum dot light emitting devices fabricated in Example 2 were measured. Specifically, the devices were fabricated by applying the PAD ligands having amine groups to $CdSe/Cd_{1-x}Zn_xS$ red quantum dots (where x is from 0 to 1 and increases gradually from 0 (the core of the quantum dots) to 1 (the outermost surface of the shell of the quantum dots (chemical composition gradient)), $Cd_{1-x}Zn_xSe/ZnS$ green quantum dots (where x is from 0 to 1 and increases gradually from 0 (the outermost portion of the core of the quantum dots) to 1 (the starting surface of the shell of the quantum dots, with the proviso that x is 0 in the core) or $Cd_{1-x}Zn_xS/ZnS$ blue quantum dots (where x is from 0 to 1 and increases gradually from 0 (the outermost portion of the core of the quantum dots) to 1 (the starting surface of the shell of the quantum dots, with the proviso that x is 0 in the core) surrounded by oleic acid ligands (OA-QDs). (A) and (B) of FIG. 13 show external quantum efficiencies and current density-voltage-luminance curves of the devices.

From these results, it can be confirmed that the introduction of the PAD ligands into the quantum dots having various compositions and energy structures improves the performance of the devices. These results are attributed to the introduction of the dendrimer ligands having amine groups that enables control over the charge injection properties of the quantum dot light emitting devices.

Evaluation Example 7: External Quantum Efficiencies of the Quantum Dot Light Emitting Devices Including the Ligand-Substituted Quantum Dot Light Emitting Layers with PEI and PEIE FIG. 16 shows external quantum efficiency-luminance curves of the quantum dot light emitting device using oleic acid and the quantum dot light emitting devices using different PAD-G0, PEI, and PEIE ligands.

Figure 16:
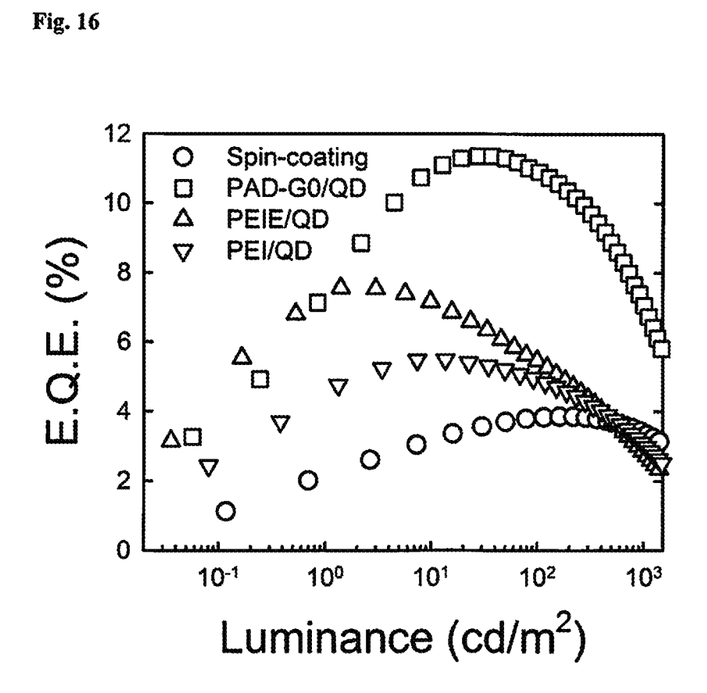
FIG. 16 shows external quantum efficiency-luminance curves of a quantum dot light emitting device using oleic acid and quantum dot light emitting devices using different PAD-G0, PEI, and PEIE ligands.

FIG. 16 reveals that the quantum dot light emitting devices using PEI and PEIE ligands having amine groups had slightly lower efficiencies than the quantum dot light emitting device into which the dendrimer ligands having amine groups were introduced but had about 1.5-2 times higher efficiencies than the conventional quantum dot light emitting device using oleic acid.

Evaluation Example 9: Comparison of Performance of the Quantum Dot Light Emitting Devices Including Ligands Having Structures and Shapes Similar to the Ligands Used in the Inventive Quantum Dot Light Emitting Devices FIG. 14 shows (A) a diagram of PAD ligands having amine groups and diagrams of pentaerythritol tetrakis(3-mercaptopropionate) (PETT) having thiol groups, and 1,2,3,4,-butanetetracarboxilic acid (BTC) having carboxyl groups, which have chemical structures similar to the PAD ligands, (B) the amounts of each of the PAD, PETT, and BTC ligands and the quantum dots alternately loaded on the ZnO thin films, which were measured by quartz crystal microgravimetry (QCM), and (C) top SEM images of the quantum dots loaded on the PAD, PETT, and BTC ligands: the surface loading densities of the quantum dots calculated through the SEM images were 100% for PAD-G3, 72% for PETT, and 41% for BTC.

FIG. 15 shows (A) photoluminescence (PL) decay dynamics when the quantum dots were coated on the PAD-G3, PETT, and BTC ligands applied to the respective ZnO/ITO substrates, (B) current density-voltage-luminance curves of the quantum dot electroluminescence diode devices using the PAD, PETT, and BTC ligands, (C) external quantum efficiency-luminance curves of the devices, and (D) electroluminescence spectra (10.2 $mA/cm^2$) of the devices.

FIG. 14 shows that small amounts of the structurally similar PETT and BTC ligands were bound to the quantum dots, unlike the PAD ligands used in the inventive quantum dot light emitting devices. FIG. 15 shows that the luminescent properties of the quantum dots varied depending on the kind of the ligands, relatively small amounts of the the PETT ligands having thiol groups and the BTC ligands having carboxyl groups were loaded in the ligand-substituted quantum dot light emitting layers, and the performance of the quantum dot light emitting devices was poor.

In conclusion, the introduction of the ligand-substituted quantum dot light emitting layer with a polymer having amine groups, such as a dendrimer, PEI or PEIE, enables control over the charge injection properties of the device so that the flow of electrons more rapid than the migration velocity of holes can be controlled, and as a result, the efficiency of the quantum dot light emitting device can be maximized. In addition, the simple ligand substitution reaction is effective in removing unnecessary oleic acid surrounding quantum dots to prevent an increase in driving voltage caused by the introduction of the additional material, achieving a marked improvement efficiency of the device. Furthermore, it is expected that the ligand substitution reaction using the polymer having amine groups will be applicable to the fabrication of quantum dot light emitting diode devices and other devices where charge injection properties need to be controlled through a change in energy level.

What is claimed is:

1. A quantum dot light emitting device comprising:
    an electron transport layer;
    a polymer layer having amine groups coated on the electron transport layer; and
    a quantum dot light emitting layer formed by coating quantum dots on the polymer layer;
    wherein the quantum dots have surface oleic acid ligands,
    wherein at least part of the quantum dot surface oleic acid ligands in contact with the polymer are ligand-substituted with said amine groups,
    wherein said polymer is a dendrimer,
    wherein said amine groups are positioned at branch terminus of the dendrimer,
    wherein said dendrimer is a generation 3 or 4 dendrimer, and
    wherein the quantum dots are bonded to said amine groups of the dendrimer by ligand substitution.

2. The quantum dot light emitting device according to claim 1, wherein the dendrimer is a polyamidoamine dendrimer.

3. The quantum dot light emitting device according to claim 1, wherein the quantum dot light emitting layer has a multilayer structure consisting of 1 to 10 layers.

4. The quantum dot light emitting device according to claim 1, wherein the electron transport layer is formed of an oxide selected from ZnO, $TiO_2$, $WO_3$, and $SnO_2$.

5. The quantum dot light emitting device according to claim 1, wherein the quantum dot light emitting layer comprises a nano-sized semiconductor compound of Groups 2-6 or 3-5 elements.

6. The quantum dot light emitting device according to claim 5, wherein the nano-sized semiconductor compound comprises cadmium selenide (CdSe), cadmium sulfide (CdS), cadmium telluride (CdTe), zinc selenide (ZnSe), zinc telluride (ZnTe), zinc sulfide (ZnS), mercury telluride (HgTe), indium arsenide (InAs), indium phosphide (InP), gallium arsenide (GaAs) or a combination thereof.

7. A method for fabricating a quantum dot light emitting device, comprising (a) forming an electron transport layer on a substrate, (b) coating a polymer having amine groups on the electron transport layer to form a polymer layer, and (c) coating quantum dots on the polymer layer to form a quantum dot light emitting layer,
    wherein the quantum dots have surface oleic acid ligands,
    wherein at least part of the quantum dot surface oleic acid ligands in contact with the polymer layer having the amine groups in step (c) are ligand-substituted with said amine groups,
    wherein said polymer is a dendrimer,
    wherein said dendrimer is a generation 3 or 4 dendrimer,
    wherein said amine groups are positioned at branch terminus of the dendrimer,
    and
    wherein the quantum dots are bonded to said amine groups of the dendrimer by ligand substitution.

8. The method according to claim 7, wherein the quantum dot light emitting layer and the electron transport layer are formed by solution processing.

9. The method according to claim 7, wherein the dendrimer is a polyamidoamine dendrimer.

10. The method according to claim 7, wherein the quantum dot light emitting layer has a multilayer structure consisting of 1 to 10 layers.

* * * * *